United States Patent [19]
Jung

[11] Patent Number: 6,084,272
[45] Date of Patent: Jul. 4, 2000

[54] ELECTROSTATIC DISCHARGE PROTECTIVE CIRCUIT FOR SEMICONDUCTOR DEVICE

[75] Inventor: Hyuck-Chai Jung, Chooncheongbuk-Do, Rep. of Korea

[73] Assignee: LG Semicon Co., Ltd., Chungcheongbuk-Do, Rep. of Korea

[21] Appl. No.: 09/263,527

[22] Filed: Mar. 5, 1999

[30] Foreign Application Priority Data

Mar. 12, 1998 [KR] Rep. of Korea .......................... 98-8271

[51] Int. Cl.⁷ .............................. H01L 27/01; H01L 27/12
[52] U.S. Cl. ............................................................. 257/355
[58] Field of Search ............................................. 257/355

[56] References Cited

U.S. PATENT DOCUMENTS 5,144,518 9/1992 Miyazake .
5,545,909 8/1996 Williams et al. .

OTHER PUBLICATIONS

C. Duvvury et al.; "Output ESD Protection Techniques for Advanced CMOS Process"; 1998 EOS/ESD Symposium Proceedings pp. 206–211.

*Primary Examiner*—Stephen D. Meier
*Attorney, Agent, or Firm*—Morgan, Lewis & Bockius LLP

[57] ABSTRACT

An electrostatic discharge protective circuit including a semiconductor substrate, an input/output pad formed on the semiconductor substrate, a PMOS transistor formed on the semiconductor substrate and having a drain connected to the input/output pad, a first n+ diffusion layer formed in the semiconductor substrate and separated from the drain of the PMOS transistor at a predetermined interval while being connected to a Vcc terminal, a deep n+ diffusion layer formed between the drain of the PMOS transistor and the first n+ diffusion layer, an NMOS transistor formed on the semiconductor substrate and having a drain connected to the input/output pad, and second n+ diffusion layers formed around the NMOS transistor in the semiconductor substrate and connected to a Vss terminal.

8 Claims, 4 Drawing Sheets

ELECTROSTATIC DISCHARGE PROTECTIVE CIRCUIT FOR SEMICONDUCTOR DEVICE

This application claims the benefit of Korean patent application No. 8271/1998, filed Mar. 12, 1998, which is hereby incorporated by reference.

BACKGROUND OF THE INVENTION

1. Field of the Invention

The present invention is directed to a semiconductor device, and more particularly, to a semiconductor device having an electrostatic discharge (ESD) protective circuit utilizing a CMOS buffer formed around an input/output pad.

2. Discussion of the Related Art

Since the introduction of 16M bit DRAMs, CMOS buffers have been widely used as input/output buffers. The CMOS buffer also functions as an electrostatic discharge (ESD) protective circuit. The structure and operational theory of a conventional CMOS buffer as an electrostatic discharge protective circuit is described below.

FIG. 1 illustrates the layout of an electrostatic discharge protective circuit of a conventional semiconductor device, namely, the CMOS buffer. FIG. 2 is a cross-sectional view of the CMOS buffer taken along line II-II' in FIG. 1.

In FIGS. 1 and 2, an input/output pad 2 is formed on a p-type semiconductor substrate 1. A PMOS transistor including a gate electrode 31, a source 32 and a drain 33 is formed at a left side of the input/output pad 2. The source 32 and the drain 33 are formed by implanting a p-type impurity into the semiconductor substrate 1. The source 32 and the drain 33 are connected to a Vcc terminal 5 and to the input/output pad 2, respectively. Around the source 32 and drain 33 of the PMOS transistor, n+ regions 34, 35 (Vcc diffusion layers) are formed in the semiconductor substrate, separated by an interval "a" of a field region and connected to the Vcc terminal 5. An NMOS transistor, including a gate electrode 41, a source 42 and a drain 43, is formed at a right side of the pad 2. The source 42 and the drain 43 are formed by implanting an n-type impurity into the p-type semiconductor substrate 1. The source 42 and the drain 43 are connected to a Vss terminal 6 and the input/output pad 2, respectively. Around the source 42 and drain 43 of the NMOS transistor, n+ regions 44, 45 (Vss diffusion layers) are formed, separated by an interval "a" of the field region and connected to the Vss terminal 6. An n-well 3 and a p-well 4 (not shown in FIG. 1) are formed in the p-type semiconductor substrate 1. The NMOS transistor and the PMOS transistor are formed in a p-well 4 and a n-well 3, respectively.

In the n-well 3, where the PMOS transistor is formed, a horizontal parasitic PNP bipolar transistor Q2 is also formed utilizing the source 32 of the PMOS transistor, the n-well 3 and the drain 33 of the PMOS transistor for its collector 32, base 3 and emitter 33. A vertical parasitic PNP bipolar transistor Q1 is also formed utilizing the emitter 33 of the horizontal PNP transistor Q2, the n-well 3 and the p-type semiconductor substrate 1 as an emitter 33 a base 3 and a collector 1. The emitter 33 is connected in series with the horizontal PNP transistor Q2. In addition, in the n-well 3, the Vcc diffusion layers 34, 35 are formed at the right and left sides of the PNP transistor Q2, separated by the interval "a" of the field region, and a base resistance Rn1 of a vertical PNP transistor Q1 is connected between a diode formed by the emitter 33 and the base 3 of the vertical PNP transistor Q1 and the Vcc diffusion layer 35. The Vcc diffusion layers 34, 35 are connected to the Vcc terminal 5.

In the p-well 4, an NMOS transistor including the gate electrode 41, the source 42 and the drain 43 is formed. A horizontal parasitic NPN bipolar transistor Q3 utilizes the source 42 of the NMOS transistor, the p-well 4 and the drain 43 as an emitter 42, a base 4 and a collector 43. The Vss diffusion layers 44, 45 are formed at right and left sides of the NPN transistor Q3 and connected to the Vss terminal 6.

The operation of the above-described CMOS buffer as an electrostatic discharge protective circuit will now be explained.

First, static electricity at the pad 2 is discharged through the following discharge path under a negative stress condition, i.e., when the static electricity has a voltage lower than Vss.

A negative charge inputted to the pad 2 is transferred to the n+ region 43 of the horizontal NPN transistor Q3. As the negative charge is transferred to the n+ region 43, a forward bias is formed between the n+ region 43 and the p-well 4, and electrons (minority carriers) move into the p-well 4. Then, the voltage of the p-well 4 is lowered due to the electrons transferred from the n+ region, and a forward bias is formed on the p-well 4 and the n+ region 42. Therefore, electrons move to the Vss terminal having a relatively high voltage through the n+ region 42, and are discharged.

When a voltage lower than Vss is applied to the pad 2, the voltage is discharged through a relatively simple path. The discharge path is formed by a forward biased junction, and the semiconductor (active) elements are therefore not damaged.

The discharge path for a positive charge condition, that is, when a positive voltage (compared to Vss and Vcc) is applied to the input/output pad 2, is relatively complicated. A reverse bias is formed between the n+ region 43 of the horizontal NPN transistor Q3 and the p-well 4, which can result in active element destruction. The discharge path for the case where a positive voltage is applied to the input/output pad 2 will now be described.

A first discharge path is formed through the base resistance Rn1, which is connected in series to the forward diode formed by the emitter 33 and base 3 of the vertical PNP transistor Q1. This discharge path is efficient for the positive voltage when current is low.

A second discharge path is formed by the NPN transistor Q3. This discharge path is used when a high electric current is conducted. First, the pad voltage is passed through the forward emitter-base diode of the vertical PNP transistor Q1 and the base resistance Rn1, and then the high voltage is applied to the n+ region 43 of the horizontal NPN transistor Q3, and forms a reverse biased diode between the n+ region 43 and the p-well 4. When the voltage of the input/output pad 2 rises constantly and exceeds an avalanche breakdown voltage of the diode formed between the n+ region 43 and the p-well 4, the horizontal NPN transistor Q3 is turned on, and thus a high electric current flows. Consequently, the positive charge being transferred through the n+ region 43 is discharged through the n+ region 42 to the Vss terminal 6, which is at a low voltage. However, if application of the high voltage continues, a second breakdown of the semiconductor elements can occur, and this can result in active (semiconductor) element destruction.

A third discharge path is represented by the current flow through the vertical PNP transistor Q1 to the substrate 1. When the semiconductor substrate 1 is connected to Vss, the positive charge is discharged to Vss. In the other cases, the semiconductor substrate current is increased, and thereby the horizontal NPN transistor Q3 is turned on.

The conventional electrostatic discharge protective circuit has a disadvantage with the second discharge path formed by the horizontal NPN transistor Q3. That is, the discharge of a positive charge is mostly through the emitter-base diode of the vertical PNP transistor Q1 and the base resistance Rn1. However, when the base resistance Rn1 is large, the positive charge cannot be efficiently discharged through the emitter-base diode of the vertical PNP transistor Q1 and the base resistance Rn1, and thus the remaining charge must be discharged through a different path, namely, the horizontal NPN transistor Q3. Here, the rising pad voltage is passed through the emitter-base diode of the vertical PNP transistor Q1 and the base resistance Rn1, and the higher input/output pad voltage causes the reverse biasing of the junction of the n+ region 43 of the NPN transistor Q3 and the p-well 4. When the pad voltage exceeds the avalanche breakdown voltage, the horizontal NPN transistor Q3 is turned on and the positive charge is discharged. However, during the high voltage condition, when the pad voltage exceeds the avalanche breakdown voltage, a second breakdown can occur, resulting in the active element destruction.

SUMMARY OF THE INVENTION

Accordingly, the present invention is directed to electrostatic discharge protective circuit for a semiconductor device that substantially obviates one or more of the problems due to limitations and disadvantages of the related art.

An object of the present invention is to prevent a semiconductor element, especially an n-channel active element, from being destroyed by static electricity.

To achieve these and other advantages and in accordance with the purpose of the present invention, as embodied and broadly described, in one aspect of the present invention there is provided an electrostatic discharge protective circuit including a semiconductor substrate, an input/output pad formed on the semiconductor substrate, a PMOS transistor formed on the semiconductor substrate and having a drain connected to the input/output pad, a first n+ diffusion layer formed in the semiconductor substrate and separated from the drain of the PMOS transistor at a predetermined interval while being connected to a Vcc terminal, a deep n+ diffusion layer formed between the drain of the PMOS transistor and the first n+ diffusion layer, an NMOS transistor formed on the semiconductor substrate and having a drain connected to the input/output pad, and second n+ diffusion layers formed around the NMOS transistor in the semiconductor substrate and connected to a Vss terminal.

In another aspect of the present invention there is provided an electrostatic discharge protective circuit including a substrate having an input/output pad formed on the substrate, a PMOS transistor formed on the substrate, the PMOS transistor including a drain connected to the input/output pad, a first n+ diffusion layer formed in the substrate, connected to a Vcc terminal and separated from the drain of the PMOS transistor, a deep n+ diffusion layer between the n+ diffusion layer and the first n+ diffusion layer, an NMOS transistor formed in the substrate, the NMOS transistor including a drain connected to the input/output pad, and second n+ diffusion layers formed in the substrate, connected to a Vss terminal and separated from the NMOS transistor.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
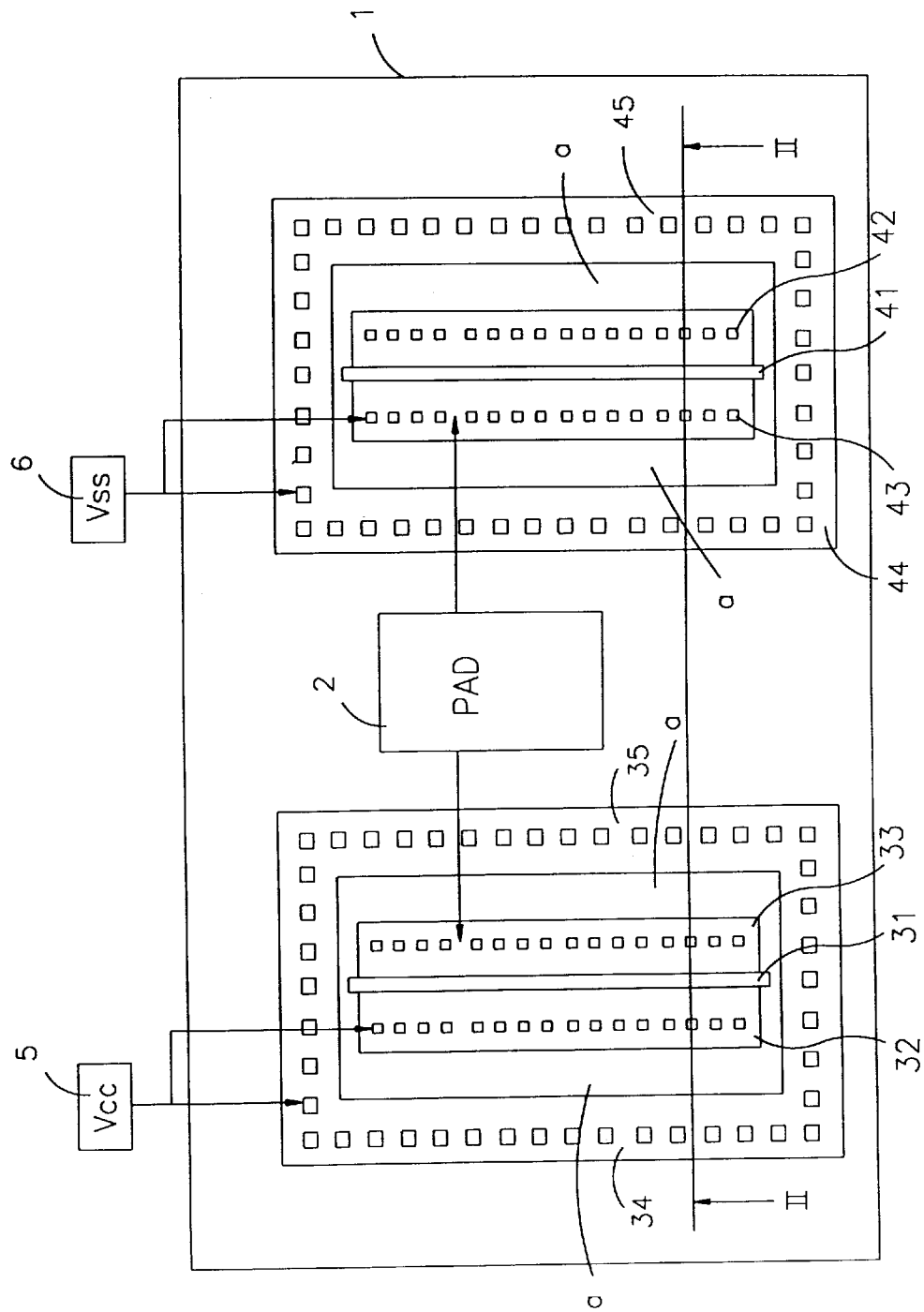
FIG. 1 illustrates a layout of a conventional CMOS buffer.
Figure 2:
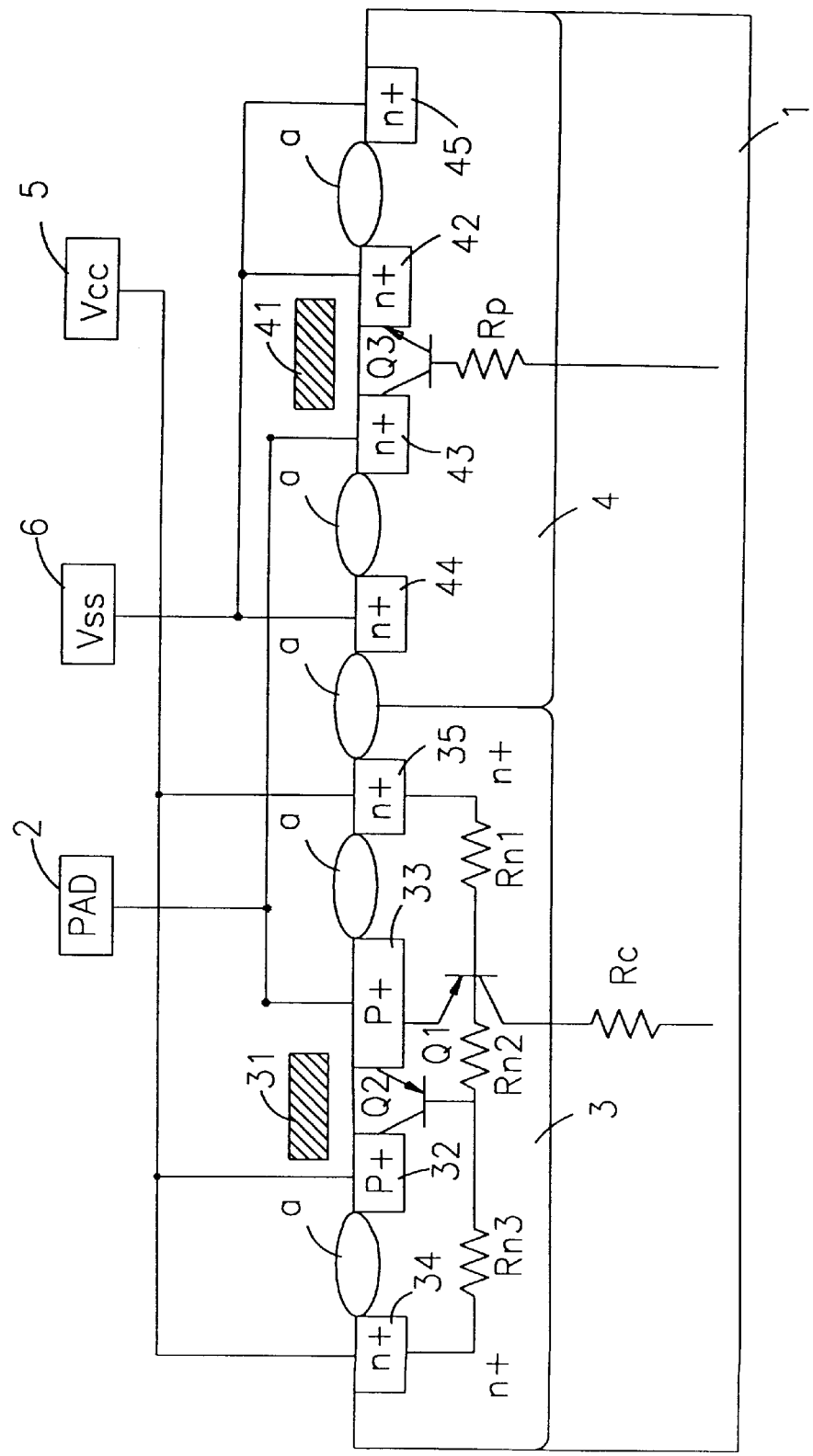
FIG. 2 is a cross-sectional view of the CMOS buffer in FIG. 1 taken along line II–II'.
Figure 3:
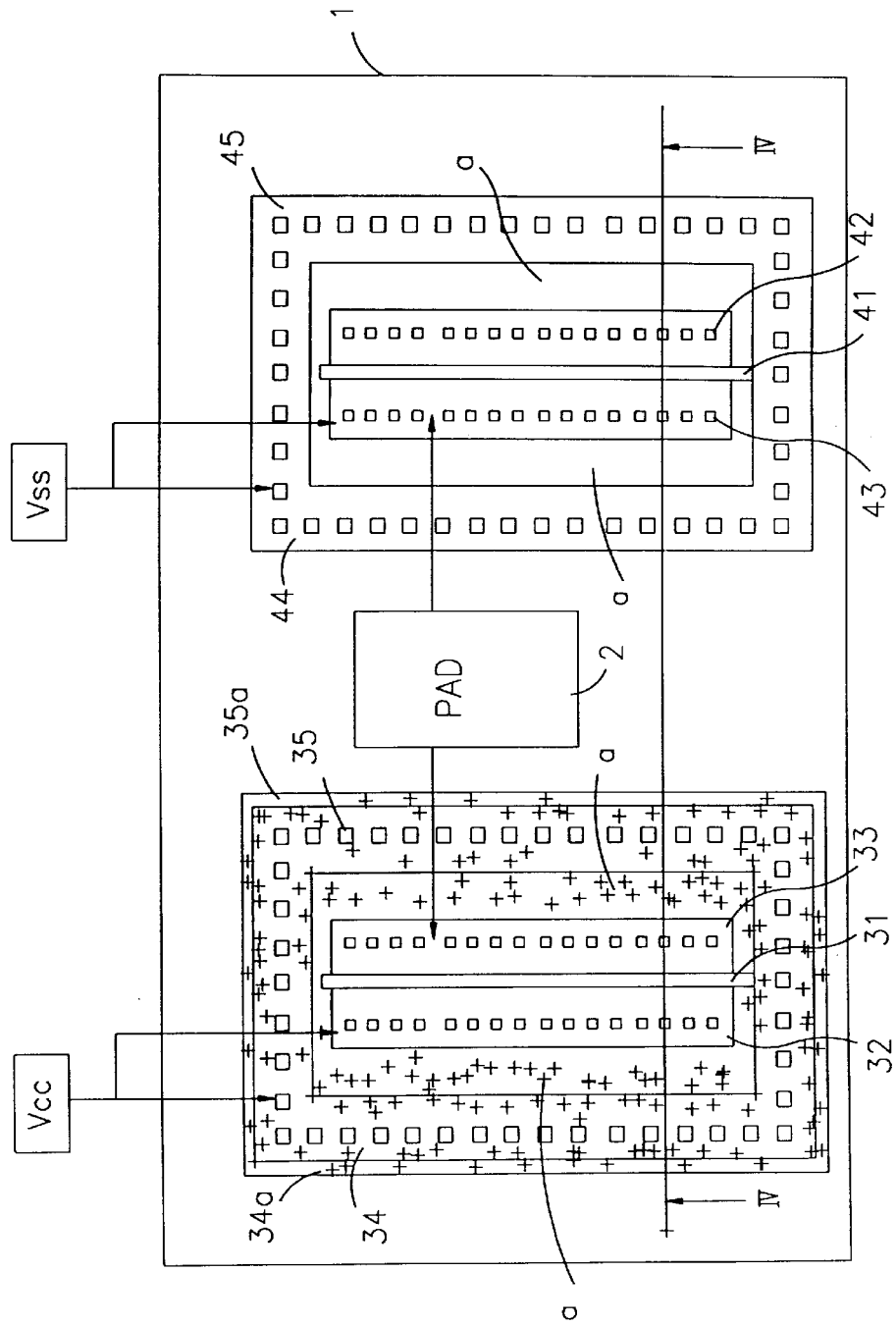
FIG. 3 illustrates a layout of an electrostatic discharge protective circuit of the present invention.
Figure 4:
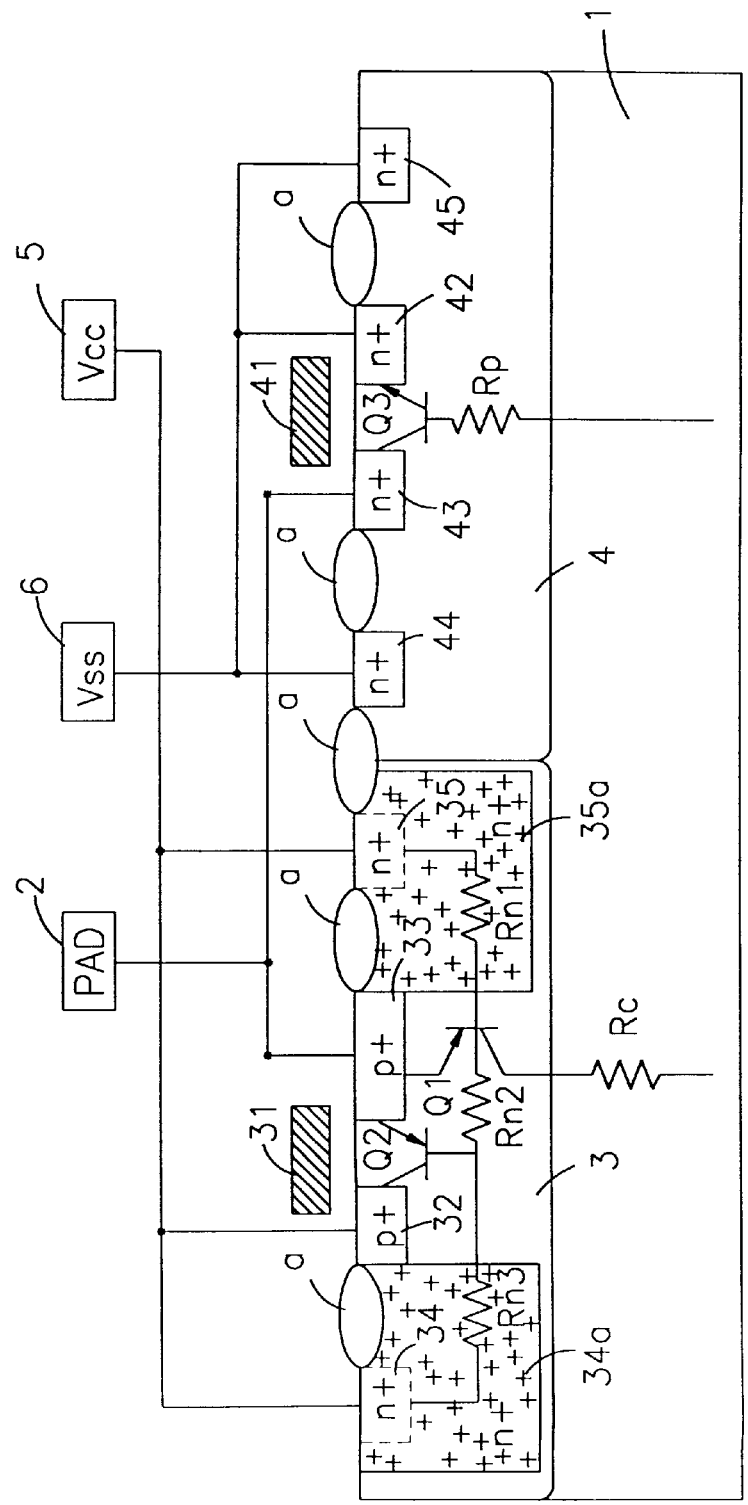
FIG. 4 is a cross-sectional view of a circuit of FIG. 3 taken along line IV–IV'.

FIG. 3 illustrates a layout of an electrostatic discharge protective circuit of the present invention, and FIG. 4 is a cross-sectional view of a CMOS buffer in FIG. 3 taken along line IV–IV'.

An input/output pad 2 is formed in a semiconductor substrate 1, and a PMOS transistor, including a gate electrode 31, a source 32 and a drain 33, is formed at a left side of the pad 2. The source 32 and drain 33 are formed by implanting a p-type impurity into the semiconductor substrate 1. The source 32 and the drain 33 are connected to a Vcc terminal 5 and the input/output pad 2, respectively. Around the source 32 and drain 33, n+ regions 34, 35 (Vcc diffusion layers) are formed in the semiconductor substrate 1, separated by an interval "a" of a field region and connected to the Vcc terminal 5. Also, deep n+ layers 34a, 35a are formed around the Vcc diffusion layers 34, 35 and extended to a source 32 and a drain 33, respectively, of an adjoining PMOS transistor. Thus, the base resistance Rn1 is reduced by forming the deep n+ region 35a between the Vcc diffusion layer 35 and the emitter 33 of the vertical PNP transistor Q1, which is formed with the source 32, the drain 33, the n-well 3, and the p-type semiconductor substrate 1.

An NMOS transistor having a gate electrode 41, a source 42 and a drain 43 is formed at a right side of the pad 2. The source 42 and the drain 43 are formed by implanting an n-type impurity into the semiconductor substrate 1, and are connected to a Vss terminal 6 and to the input/output pad 2, respectively. Further, n+ regions 44, 45 (Vss diffusion layers) are formed around the source 42 and drain 43 of the NMOS transistor, separated by an interval "a" of the field region and connected to the Vss terminal 6.

According to the present invention, the CMOS buffer is produced by forming the n-well 3 and the p-well 4 in the p-type semiconductor substrate 1. However, if a p-type semiconductor substrate is used, the CMOS buffer can be formed by merely forming the n-well 3. Also, if an n-type semiconductor substrate is used, the CMOS buffer can be formed by forming the p-well 4.

As illustrated in FIG. 4, the n-well 3 and the p-well 4 are formed in the p-type semiconductor substrate 1. In the n-well 3, the PMOS transistor is formed, and a horizontal parasitic PNP transistor Q2 utilizing the source 32 of the PMOS transistor, the n-well 3 and the drain 33 of the PMOS transistor as a collector 32, a base 3 and an emitter 33, respectively, is also formed. Also, a vertical parasitic PNP bipolar transistor Q1 using the emitter 33 of the horizontal PNP transistor Q2, the n-well 3 and the p-type semiconductor substrate 1 as an emitter 33, a base 3 and a collector 1, respectively, is also formed, and connected in series to the horizontal PNP transistor Q2. In addition, in the semiconductor substrate 1, the n+ regions (the Vcc diffusion layers) 34, 35 are formed at the right and left sides of the PNP transistor Q2. The Vcc diffusion layers 34, 35 are separated from the PNP transistor Q2 by an interval "a" of field region. The base resistance Rn1 of the PNP transistor Q1 is connected between a diode formed by the emitter 33 and the base 3 of the vertical PNP transistor Q1 and the Vcc diffusion layer 35. The Vcc diffusion layers 34, 35 are connected to the Vcc terminal 5, and the deep n+ diffusion layers 34a, 35a are formed around the Vcc diffusion layers 34, 35.

In addition, in the p-well 4, the NMOS transistor having the gate electrode 41, the source 42 and the drain 43 is formed. Also formed in the p-well 4 is a horizontal parasitic NPN bipolar transistor Q3 using the source 42 of the NMOS transistor, the p-well 4 and the drain 43 of the NMOS transistor as its emitter 42, base 4 and collector 43, respectively. The Vss diffusion layers 44, 45 are formed at the right and left sides of the NPN transistor Q3, respectively, and are connected to the Vss terminal 6.

The discharge path of the electrostatic discharge protective circuit of the present invention is identical to that of the conventional circuit. However, the deep n+ layers 34a, 35a formed around the Vcc diffusion layers 34, 35, i.e., the deep n+ region 35a formed between the emitter 33 of the vertical PNP transistor Q1 and the Vcc layer 35, reduce the base resistance Rn1. Therefore, a positive charge can be efficiently discharged through the emitter-base diode of the vertical PNP transistor Q1 and the base resistance Rn1. Consequently, a rise in the pad voltage, generated when a positive charge is passed through the emitter-base diode of the vertical PNP transistor Q1 and the base resistance Rn1, can be reduced. That is, a second breakdown of the reverse biased junction, formed between the n+ region 43 of the horizontal NPN transistor Q3 and the p-well 4, is prevented by reducing the rise in the pad voltage, which in turn prevents the active elements from being destroyed. Thus, the object of the present invention can be achieved by reducing the base resistance Rn1 of the vertical PNP transistor Q1, which reduces the increase in the pad voltage when static electricity is discharged.

As described, the present invention improves the reliability of the semiconductor device by preventing the NMOS transistor of the CMOS buffer from being destroyed due to an electrostatic discharge when static electricity is generated.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. An electrostatic discharge protective circuit comprising:
    a semiconductor substrate;
    an input/output pad formed on the semiconductor substrate;
    a PMOS transistor formed on the semiconductor substrate and having a drain connected to the input/output pad;
    a first n+ diffusion layer formed in the semiconductor substrate and separated from the drain of the PMOS transistor at a predetermined interval while being connected to a Vcc terminal;
    a first deep n+ diffusion layer formed between the drain of the PMOS transistor and the first n+ diffusion layer;
    an NMOS transistor formed on the semiconductor substrate and having a drain connected to the input/output pad; and
    second n+ diffusion layers formed around the NMOS transistor in the semiconductor substrate and connected to a Vss terminal,
    wherein the semiconductor substrate is a p-type substrate and has an n-well and a p-well,
    wherein the NMOS transistor is formed on the p-well, and the PMOS transistor is formed on the n-well, and
    wherein the first deep n+ diffusion layer has higher doping concentration than the n-well.

2. The circuit of claim 1, wherein the semiconductor substrate is a p-type substrate.

3. An electrostatic discharge protective circuit comprising:
    a substrate having an input/output pad formed on the substrate;
    a PMOS transistor formed on the substrate, the PMOS transistor including a drain connected to the input/output pad;
    a first n+ diffusion layer formed in the substrate, connected to a Vcc terminal and separated from the drain of the PMOS transistor;
    a first deep n+ diffusion layer between the n+ diffusion layer and the first n+ diffusion layer;
    an NMOS transistor formed in the substrate, the NMOS transistor including a drain connected to the input/output pad; and
    second n+ diffusion layers formed in the substrate, connected to a Vss terminal and separated from the NMOS transistor,
    wherein the semiconductor substrate is a p-type substrate and has an n-well and a p-well,
    wherein the NMOS transistor is formed on the p-well, and the PMOS transistor is formed on the n-well, and
    wherein the first deep n+ diffusion layer has higher doping concentration than the n-well.

4. The circuit of claim 3, wherein the substrate is a p-type substrate.

5. An electrostatic discharge protective circuit comprising:
    a semiconductor substrate;
    an input/output pad formed on the semiconductor substrate;
    a PMOS transistor formed on the semiconductor substrate and having a drain connected to the input/output pad;
    a first n+ diffusion layer formed in the semiconductor substrate and separated from the drain of the PMOS transistor at a predetermined interval while being connected to a Vcc terminal;
    a first deep n+ diffusion layer formed between the drain of the PMOS transistor and the first n+ diffusion layer;
    an NMOS transistor formed on the semiconductor substrate and having a drain connected to the input/output pad; and
    second n+ diffusion layers formed around the NMOS transistor in the semiconductor substrate and connected to a Vss terminal, wherein the semiconductor substrate is a p-type substrate and has an n-well and a p-well;

a third n+ diffusion region formed in the n-well and connected to the Vcc terminal;

a source of the PMOS transistor formed in the n-well; and a second deep n+ difusion layer formed in the n-well between the third n+ diffusion region and the source of the PMOS transistor, wherein the second deep n+ diffusion layer has higher doping concentration than the n-well.

6. The circuit of claim 5, wherein the first deep n+ diffusion layer has higher doping concentration than the n-well.

7. An electrostatic discharge protective circuit comprising:

a substrate having an input/output pad formed on the substrate;

a PMOS transistor formed on the substrate the PMOS transistor including a drain connected to the input/output pad;

a first n+ diffusion layer formed in the substrate connected to a Vcc terminal and separated from the drain of the PMOS transistor;

a first deep n+ diffusion layer between the n+ diffusion layer and the first n+ diffusion layer;

an NMOS transistor formed in the substrate, the NMOS transistor including a drain connected to the input/output pad;

second n+ diffusion layers formed in the substrate connected to a Vss terminal and separated from the NMOS transistor, wherein the semiconductor substrate is a p-type substrate and has an n-well and a p-well;

a third n+ diffusion region formed in the n-well and connected to the Vcc terminal;

a source of the PMOS transistor formed in the n-well; and a second deep n+ difusion layer formed in the n-well between the third n+ diffusion region and the source of the PMOS transistor, wherein the second deep n+ diffusion layer has higher doping concentration than the n-well.

8. The circuit of claim 7, wherein the first deep n+ diffusion layer has higher doping concentration than the n-well.

* * * * *